(12) United States Patent
Yamada et al.

(10) Patent No.: US 6,906,384 B2
(45) Date of Patent: Jun. 14, 2005

(54) SEMICONDUCTOR DEVICE HAVING ONE OF PATTERNED SOI AND SON STRUCTURE

(75) Inventors: Takashi Yamada, Ebina (JP); Tsutomu Sato, Yokohama (JP); Shinichi Nitta, Yokohama (JP); Hajime Nagano, Yokohama (JP); Ichiro Mizushima, Yokohama (JP); Hisato Oyamatsu, Yokohama (JP); Yoshihiro Minami, Fujisawa (JP); Shinji Miyano, Yokohama (JP); Osamu Fujii, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 82 days.

(21) Appl. No.: 10/096,655

(22) Filed: Mar. 14, 2002

(65) Prior Publication Data

US 2003/0151112 A1 Aug. 14, 2003

(30) Foreign Application Priority Data

Feb. 13, 2002 (JP) ........................................ 2002-035681

(51) Int. Cl.$^7$ .............................................. H01L 27/01
(52) U.S. Cl. ...................... 257/347; 257/202; 257/67; 257/211; 257/206; 257/203; 257/74; 257/369
(58) Field of Search .............................. 257/64, 65, 66, 257/67, 69, 347, 162, 206, 165, 129, 350, 391, 202, 211, 203, 74, 369

(56) References Cited

U.S. PATENT DOCUMENTS 5,612,552 A * 3/1997 Owens ........................ 257/202

6,140,163 A * 10/2000 Gardner et al. .............. 438/157

FOREIGN PATENT DOCUMENTS

| JP | 7-106434 | 4/1995 |
| JP | 8-17694 | 1/1996 |
| JP | 8-316431 | 11/1996 |
| JP | 10-303385 | 11/1998 |
| JP | 11-238860 | 8/1999 |
| JP | 2000-91534 | 3/2000 |
| JP | 2000-243944 | 9/2000 |

OTHER PUBLICATIONS

S. M. Sze, "Physics of Semiconductor Devices," John Wiley & Sons, New York, (1981) p. 451.*

(Continued)

*Primary Examiner*—Eddie Lee
*Assistant Examiner*—Thomas Magee
(74) *Attorney, Agent, or Firm*—Oblon, Spivak, McClelland, Maier & Neustadt, P.C.

(57) ABSTRACT

A semiconductor device includes first and second semiconductor layers and first and second MOS transistors. The first semiconductor layer is provided on and electrically connected to the semiconductor substrate. The second semiconductor layer is provided near the first semiconductor layer and formed above the semiconductor substrate via one of an insulating film and a cavity. The first and second MOS transistors are respectively provided on the first and second semiconductor layers, and each has a gate electrode arranged parallel to a boundary between the first and second semiconductor layers.

19 Claims, 14 Drawing Sheets

OTHER PUBLICATIONS

Ghavam G. Shahidi, "SOI Technology for the GHz Era," Proc. International Symposium on VLSI Technology, Systems, and Applications, (2001), pp. 11–14.*

Ghavam G. Shahidi, Carl A. Anderson, Barbara A. Chappell, Terry I. Chappell, James H. Comfort, Bijan Davari, Robert H. Dennard, Robert L. Franch, Patricia A. McFarland, James S. Neely, Tak H. Ning, Michael R. Polcari, and James D. Warnock, IEEE.*

Jean–Pierre Colinge, "Thin Film SOI Technology: The Solution to Many Submicron CMOS Problems," Technical Digest–Proc. IEDM, (1989) pp. 34.1.1–34.1.4.*

U.S. Appl. No. 10/096,655, filed Mar. 14, 2002, Yamada et al.

U.S. Appl. No. 10/653,093, filed Sep. 3, 2003, Yamada et al.

U.S. Appl. No. 10/654,030, filed Sep. 4, 2003, Minami et al.

U.S. Appl. No. 09/650,748, filed Aug. 30, 2000, Unknown.

U.S. Appl. No. 09/995,594, filed Nov. 29, 2001, Pending.

U.S. Appl. No. 10/075,465, filed Feb. 15, 2002, Pending.

U.S. Appl. No. 10/078,344, filed Feb. 21, 2002, Pending.

U.S. Appl. No. 10/096,655, filed Mar. 14, 2002, Yamada et al.

U.S. Appl. No. 10/699,676, filed Nov. 4, 2003, Yamada et al.

Robert Hannon, et al., "0.25 $\mu$m Merged Bulk DRAM and SOI Logic Using Patterned SOI", 2000 Symposium on VLSI Technology Digest of Technical Papers; Jun. 13, 2000 Ch. 7.4, pp. 66–67.

H. L. Ho, et al. "A 0.13 $\mu$m High–Performance SOI Logic Technology With Embedded DRAM for System–On–A–Chip Application", 2001 IEDM Technical Digest, Dec. 2, 2001, pp. 503–506.

* cited by examiner

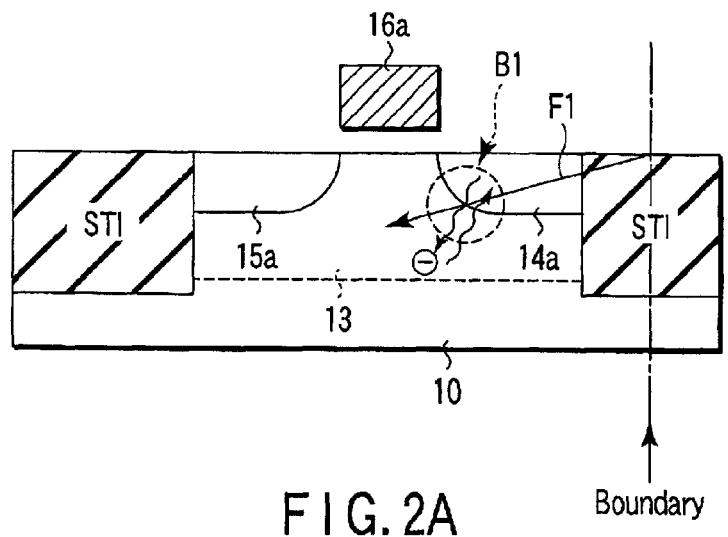
F I G. 2A
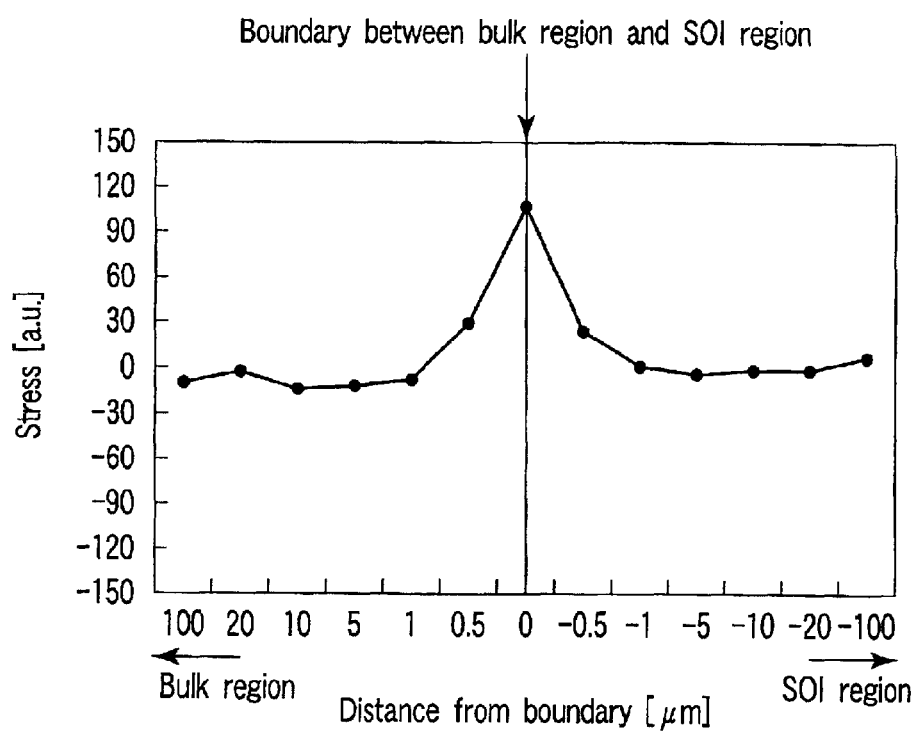
F I G. 2B

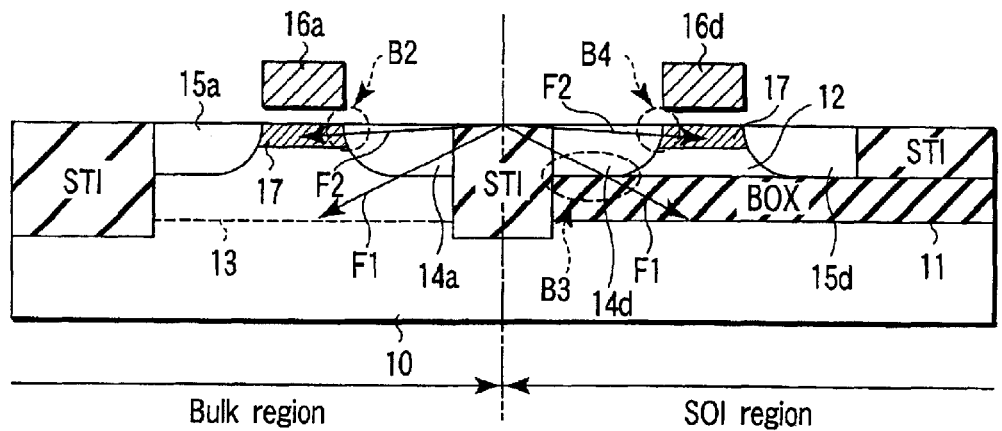
F I G. 3A
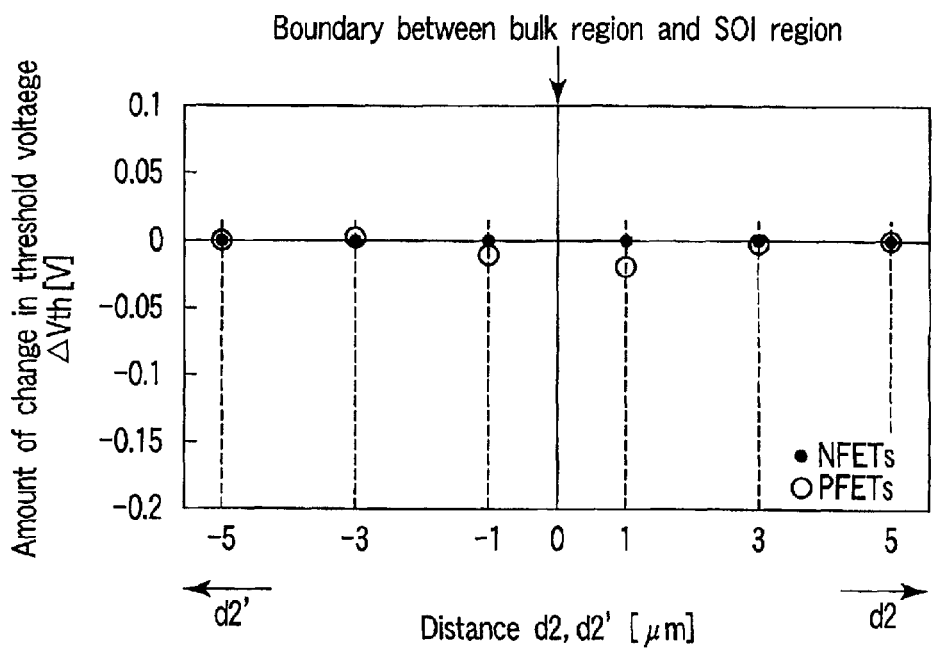
F I G. 3B

SEMICONDUCTOR DEVICE HAVING ONE OF PATTERNED SOI AND SON STRUCTURE

CROSS-REFERENCE TO RELATED APPLICATIONS

This application is based upon and claims the benefit of priority from the prior Japanese Patent Application No. 2002-035681, filed Feb. 13, 2002, the entire contents of which are incorporated herein by reference.

BACKGROUND OF THE INVENTION

1. Field of the Invention

The present invention relates to a semiconductor device, and more particularly to a technique employed in a system LSI using an SOI (Silicon On Insulator) substrate or an SON (Silicon On Nothing) substrate.

2. Description of the Related Art

Conventionally, the SOI is widely known as a structure having a silicon layer formed on an insulating film. In recent years, reductions in the power consumption or increases in the operation speed of a logic circuit have been positively attempted by forming semiconductor elements on the SOI. It is expected that the SOI will be used in a system LSI embedded a DRAM (Dynamic Random Access Memory).

A MOS transistor formed on an SOI may exhibit an unusual phenomenon caused by floating of a potential of a body region in which a channel is formed. This phenomenon is called the floating body effect. The floating body effect causes fluctuations in the leakage current or the threshold voltage in a semiconductor element. Therefore, a MOS transistor formed on an SOI is unsuited for a circuit that requires the leakage current or the threshold voltage to be controlled accurately, for example, a DRAM cell array or a sense amplifier. On the other hand, a MOS transistor formed on an SOI is most suited for a logic circuit which performs digital operations. Thus, whether the SOI is suited for a circuit or not depends on the type of circuit.

For this reason, a structure is proposed, in which an SOI is formed on a part of a semiconductor substrate (hereinafter referred to as a patterned SOI structure). In this structure, a logic circuit is formed on an SOI on a part of the semiconductor substrate (an SOI region), while a DRAM is formed on a region where the SOI is not formed (a bulk region). A method for forming the patterned SOI is proposed in Jpn. Pat. Appln. KOKAI Publications Nos. 8-17694, 10-303385, 8-316431, 7-106434, 11-238860, 2000-91534 and 2000-243944, "2000 Symposium on VLSI Technology Digest of Technical Papers" by Robert Hannon et al., pp. 66–67, and "2000 IEDM Technical Digest" by Ho et al., pp. 503–506.

If a patterned SOI is used, MOS transistors on the SOI and the silicon layer of the same semiconductor substrate can be used in different ways according to the characteristics of the semiconductor elements. Therefore, the operation speed and the performance of a system LSI can be increased.

However, near the boundary between the SOI region and the bulk region, a stress is generated owing to the boundary forming process, or difference in substrate structure between the regions. This stress and crystal defects due to the stress can cause change in the mobility of electrons or holes, in the diffusion profiles of impurity dopants, and in junction leakage current. As a result, in the conventional patterned SOI structure, the characteristics of a semiconductor element located on the boundary between the SOI region and the bulk region may be changed.

BRIEF SUMMARY OF THE INVENTION

A semiconductor device according to an aspect of the present invention comprises:

a first semiconductor layer provided on and electrically connected to a semiconductor substrate;

a second semiconductor layer provided near the first semiconductor layer and formed above the semiconductor substrate via one of an insulating film and a cavity; and first and second MOS transistors, respectively provided on the first and second semiconductor layers and each having a gate electrode arranged parallel to a boundary between the first and second semiconductor layers.

BRIEF DESCRIPTION OF THE SEVERAL VIEWS OF THE DRAWING

FIG. 2A is a cross-sectional view of a MOS transistor;

FIG. 2B is a graph showing the relationship between a stress and a distance from the boundary between the bulk region and the SOI region;

FIG. 3A is a cross-sectional view of the semiconductor device according to the first embodiment of the present invention;

FIG. 3B is a graph showing the relationship between a distance from the boundary between the bulk region and the SOI region and an amount of change in threshold voltage;

DETAILED DESCRIPTION OF THE INVENTION

Figure 1A:
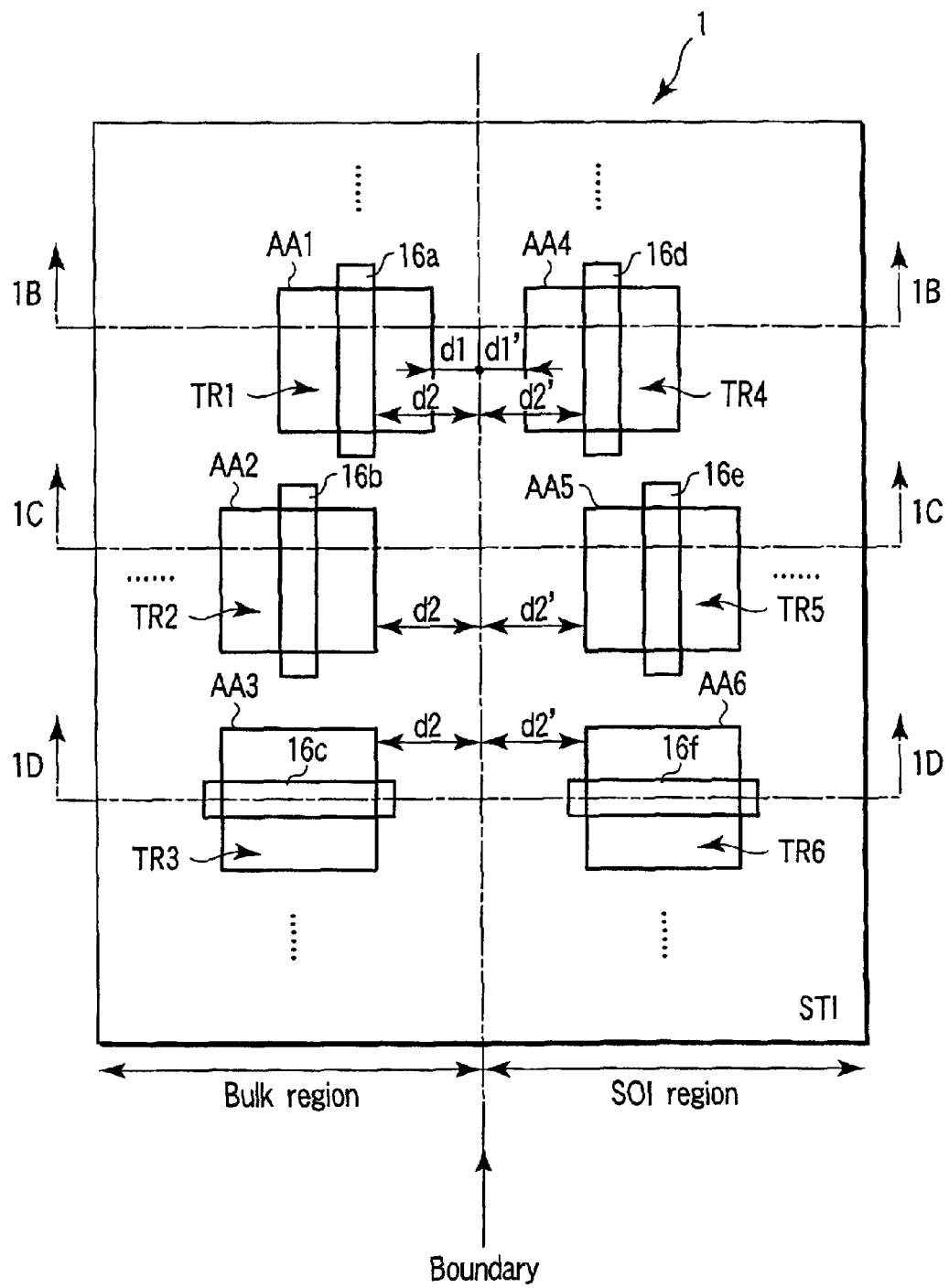
FIG. 1A is a plan view of a semiconductor device according to a first embodiment of the present invention.

A semiconductor device according to a first embodiment of the present invention will be described with reference to FIG. 1A. FIG. 1A is a plan view of a semiconductor device having a patterned SOI structure.

As illustrated in FIG. 1A, the semiconductor device 1 has a bulk region and an SOI region. The bulk region and the SOI region include element regions AA1 to AA6, which are electrically isolated from one another by element isolating regions STI. The element regions AA1 to AA6 respectively include MOS transistors TR1 to TR6. The MOS transistors TR1 to TR6 respectively have gate electrodes 16a to 16f. The gate electrodes 16a, 16b, 16d and 16e of the MOS transistors TR1, TR2, TR4 and TR5 extend parallel to the boundary between the bulk region and the SOI region. The gate electrodes 16c and 16f of the MOS transistor TR3 and TR6 extend perpendicular to the boundary.

The element region AA1 is located at a predetermined distance d1 from the boundary. The element regions AA2 and AA3 are located at a predetermined distance d2 from the boundary. The element region AA4 is located at a predetermined distance d1' from the boundary. The element regions AA5 and AA6 are located at a predetermined distance d2' from the boundary. The distances d2 and d2' are safe distances, which can avoid an influence of a stress generated at the boundary. The safe distance will be described later in detail. The distance d1 is smaller than the distance d2, and the distance d1' is smaller than the distance d2'. In other words, the element regions AA1 and AA4 are situated near the boundary at a distance shorter than the safe distance. However, the distance between the boundary and each of the channel regions of the MOS transistors TR1 and TR4 is equal to or longer than the safe distances d2 and d2'.

Figure 1B:
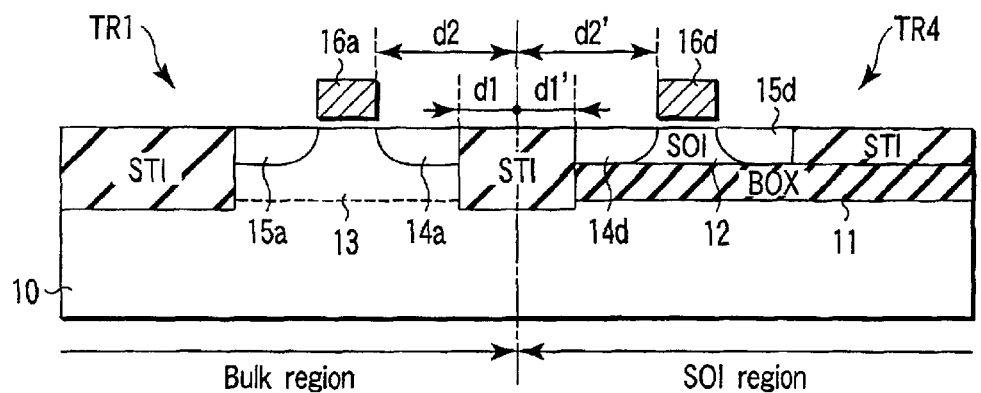
FIGS. 1B, 1C and 1D are cross-sectional views respectively taken along the lines 1B—1B, 1C—1C and 1D—1D in FIG. 1A.
Figure 1C:
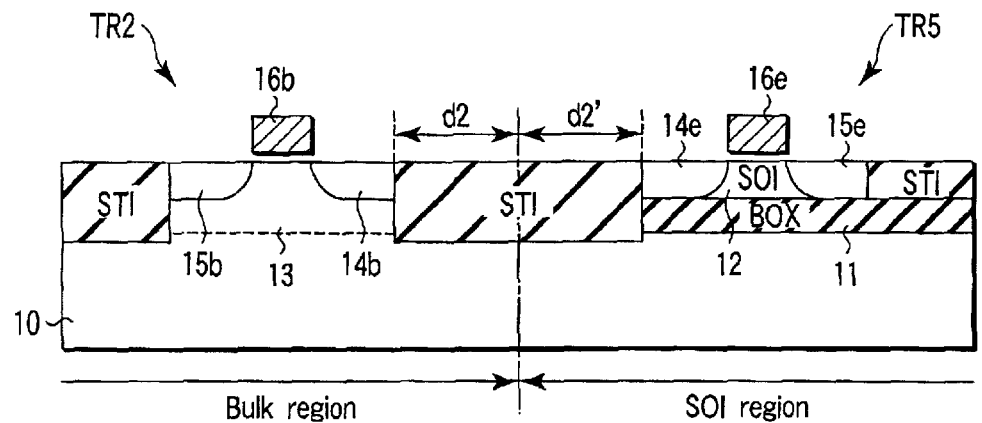
Figure 1D:
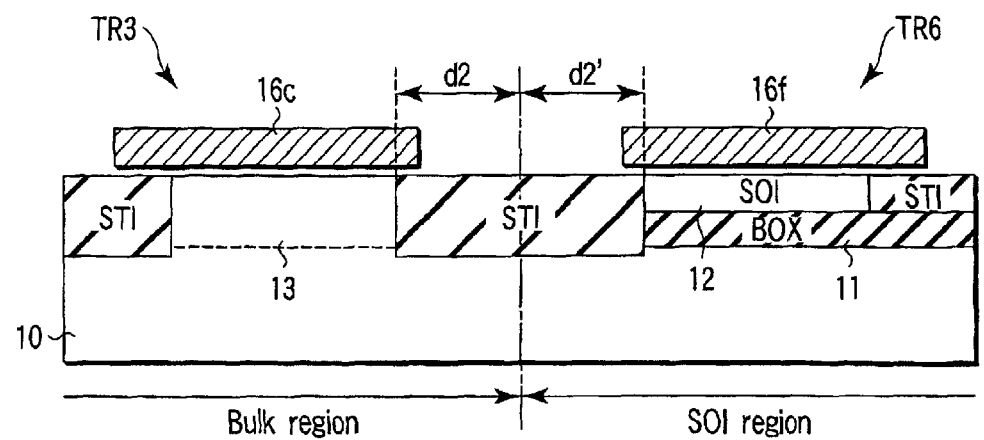

A cross-sectional structure of the semiconductor device shown in FIG. 1A will now be described with reference to FIGS. 1B to FIG. 1D. FIGS. 1B, 1C and 1D are cross-sectional views respectively taken along the lines 1B—1B, 1C—1C and 1D—1D in FIG. 1A.

As illustrated in the drawings, an SOI structure is formed in a part of a silicon substrate 10. More specifically, an insulating layer 11 is provided on one region of the silicon substrate 10, and a semiconductor layer 12 is provided on the insulating layer 11. The insulating layer 11 is, for example, a silicon oxide film, and hereinafter referred to as the BOX (Buried Oxide) layer. The semiconductor layer 12 is, for example, a silicon layer, and hereinafter referred to as the SOI layer. A semiconductor layer, for example, a silicon layer 13, is provided on the other region of the silicon substrate 10. The region where the SOI structure including the BOX layer 11 and the SOI layer 12 is formed on the silicon substrate 10 is an SOI region, whereas the region where the silicon layer 13 is formed on the silicon substrate 10 is a bulk region. The SOI layer 12 is electrically isolated from the silicon substrate 10 by the BOX layer 11, while the silicon layer 13 is electrically connected to the silicon substrate 10. The element regions AA1 to AA3 and the element regions AA4 to AA6 are respectively provided in the bulk region and the SOI region. Each of the element regions AA1 to AA6 is surrounded by element isolating regions STI. The element isolating region STI in the SOI region and the element isolating region STI in a boundary portion between the bulk region and the SOI region are formed to reach to at least the BOX layer 11.

As described above, the MOS transistors TR1 to TR6 are respectively provided in the element regions AA1 to AA6. Each of the MOS transistors TR1 to TR3 in the element regions AA1 to AA3 has source and drain regions and a gate electrode. The source regions 14a and 14b of the MOS transistors TR1 and TR2 are respectively separated from the drain regions 15a and 15b in a surface region of the silicon layer 13 in the element regions AA1 and AA2. The gate electrodes 16a and 16b of the MOS transistors TR1 and TR2 are formed on a gate insulating film (not shown) provided on those parts of the silicon layer 13 which are located between the source region 14a and the drain region 15a and between the source region 14b and the drain region 15b. The MOS transistor TR1 is formed such that the source region 14a is situated near the boundary between the bulk region and the SOI region and the source region 14a has the same potential as that of the silicon layer 13. Also in the MOS transistor TR3, the source and drain regions (not shown) are separated from each other in a surface region of the silicon layer 13 in the element region AA3. The gate electrode 16c is formed on a gate insulating film (not shown) provided on that part of the silicon layer 13 which is located between the source and drain regions. Each of the MOS transistors TR4 to TR6 in the element regions AA4 to AA6 has source and drain regions and a gate electrode. The source regions 14d and 14e of the MOS transistors TR4 and TR5 are respectively separated from the drain regions 15d and 15e in the surface region of the silicon layer 13 in the element regions AA4 and AA5. The gate electrodes 16d and 16e of the MOS transistors TR4 and TR5 are formed on a gate insulating film (not shown) provided on those parts of the silicon layer 13 which are located between the source region 14d and the drain region 15d and between the source region 14e and the drain region 15e. Also in the MOS transistor TR6, the source and drain regions (not shown) are separated from each other in a surface region of the silicon layer 13 in the element region AA6. The gate electrode 16f is formed on a gate insulating film (not shown) provided on that part of the silicon layer 13 which is located between the source and drain regions. The source regions 14d and 14e and the drain regions 15d and 15e of the element regions AA4 and AA5 and the source and drain regions (not shown) in the element region AA6 are formed such that the bottoms thereof reach to the BOX layer 11.

"The safe distance" mentioned above in connection with FIG. 1A will be described in detail with reference to FIG. 2A. FIG. 2A is a cross-sectional view of a semiconductor device having a patterned SOI structure, particularly a bulk region of the device. It is assumed that a MOS transistor is situated in the bulk region near the boundary between the bulk region and the SOI region, as shown in FIG. 2A. As described in the section of background of the invention, a stress is generated near the boundary between the SOI region and the bulk region, owing to the method of forming the boundary and the change in substrate structure. In FIG. 2A, the arrow F1 extending from the boundary represents stress. The stress F1 and crystal defects due to the stress can cause generation of a leakage current, as described before. In the example shown in FIG. 2A, when a stress acts on a pn junction between the source region 14a and the silicon layer 13 in a region B1, a leakage current flowing between the source region 14a and the silicon layer 13 is generated. The same phenomenon occurs also in the SOI region. The stress is the strongest on the boundary, and attenuated as the distance from the boundary increases. Therefore, to maintain the reliability of the semiconductor element, it is desirable that the semiconductor element is spaced apart from the boundary at a distance long enough to sufficiently attenuate the stress generating at the boundary. Thus, "the safe distance" is the distance from the boundary that allows the stress to attenuate to such an extent as not to influence the semiconductor element. In this embodiment, the element regions AA2, AA3, AA5 and AA6 are spaced apart from the boundary at the safe distances d2 and d2' in the bulk region and the SOI region respectively.

FIG. 2B shows an example of the stress distribution. FIG. 2B is a graph showing the relationship between a strength of stress and a distance from the boundary between the bulk region and the SOI region. The vertical axis represents a stress. On the axis, a positive value denotes a compressive stress, while a negative value denotes a tensile stress. The horizontal axis represents a distance. On the axis, a positive value denotes a bulk region and a negative value denotes an SOI region. As clear from the graph, the stress is the strongest at the boundary and attenuates as the distance from the boundary increases.

As described above, in the semiconductor device according to this embodiment, the element regions AA2, AA3, AA5 and AA6 are spaced apart from the boundary between the bulk region and the SOI region by the safe distances d2 and d2'. Therefore, the stress generated at the boundary is fully attenuated in the element regions AA2, AA3, AA5 and AA6. Thus, the element regions are not adversely affected by the stress. Consequently, a change in characteristic of the semiconductor device due to a stress can be prevented, so that the reliability of the semiconductor device can be improved.

In the element regions AA1 and AA4, the gate electrodes 16a and 16d of the MOS transistors TR1 and TR4 extend parallel to the boundary between the bulk region and the SOI region. As a result, a change in characteristic of the semiconductor device due to a stress can be prevented, while the element regions can be close to the boundary, so that the dead space can be reduced. This point will be described with reference to FIG. 3A. FIG. 3A is a cross-sectional view of a semiconductor device having a patterned SOI structure.

First, explanations for the bulk region will be given. The source region 14a located in close proximity to the boundary is generally set to the same potential as that of the silicon layer 13. Since there is no difference in potential between the source region 14a and the silicon layer 13, even if the stress F1 as shown in FIG. 3A and crystal defects due to the stress F1 is generated, a leakage current in the junction between the source region 14a and the silicon layer 13 is not easily generated. Thus, the stress acting on the junction does not greatly influence the characteristics of the semiconductor device. Therefore, the source region 14a can be located at the distance d1 from the boundary, shorter than the safe distance d2. In other words, the distance d1 between the element region AA1 and the boundary can be shorter than the safe distance d2. The stress F1 acting on the junction between the source region 14a and the silicon layer 13 thus need not be taken into account. Then, a stress F2 acting on the channel region 17 should be considered. In a region B2 of the channel region 17, on which the stress acts, the motilities of the carriers change. In addition, crystal defects generated owing to the stress change the impurity concentration profile of the channel region, and lowers the withstand voltage of the gate insulating film. These factors considerably change (deteriorate) the characteristics of the MOS transistor. Therefore, the element region AA1 must be arranged such that the channel region 17 is not affected by the action of the stress. If the distance between the channel region 17 and the boundary is set to the safe distance d2 or longer, the stress cannot adversely affect the characteristics of the MOS transistor.

Explanations for the SOI region will now be given. The source and drain regions 14d and 15d of the MOS transistor in the SOI region are generally formed to reach to the BOX layer 11. In a region B3 shown in FIG. 3A, since the source and drain regions 14d and 15d reach the BOX layer 11, even if the stress F1 is generated, no leakage current will be generated. Therefore, also in the SOI region, only a stress F2 acting on the channel region 17 should be considered. Therefore, if the distance between the channel region 17 and the boundary is set to the safe distance d2' or longer, as shown in FIGS. 1A and 1B, the stress cannot adversely affect the characteristics of the MOS transistor. FIGS. 1A and 1B show the case in which the source region 14d is close to the boundary, but instead, the drain region 15d may be close to the boundary.

FIG. 3B shows the relationship between the distance d2 or d2' and an amount of change in threshold voltage ΔVth of the MOS transistor formed in the region AA1 or AA4. The vertical axis represents an amount of change from the threshold voltage of a MOS transistor located at a position sufficiently separated from the boundary. The horizontal axis represents a distance. On the axis, a positive value denotes the distance d2 in the bulk region and a negative value denotes the distance d2' in the SOI region. The safe distances d2 and d2' vary depending on the boundary structure or process. However, as clear from FIG. 3, for example, even if the safe distances d2 and d2' are as small as 1 μm, the threshold voltage does not substantially change.

Essentially, from the viewpoint of maintenance of the reliability of a semiconductor element, it is desirable that the distance between the semiconductor element and the boundary be as long as possible. However, an increase in distance between the semiconductor element and the boundary leads to an increase in useless area (dead space) that cannot be readily used as an element region. The increase the dead space result in rise a cost for manufacturing a semiconductor device. Thus, from the viewpoint of cost reduction, the distance between the semiconductor element and the boundary be as short as possible. However, in the semiconductor device according to this embodiment, the distance between the boundary and each of the element regions AA1 and AA4 can be smaller than the safe distances d2 and d2', while the influence of the stress on the MOS transistors TR1 and TR4 in the element regions is eliminated. Thus, it is possible to achieve both the maintenance of reliability of the semiconductor element and the cost reduction, which are contradictory to each other.

As described above, according to this embodiment, the characteristics of the semiconductor device are prevented from changing due to the stress generated at the boundary by arranging the element regions at sufficiently safe distances from the boundary. Further, the distance between the element region and the boundary can be shorter than the safe distance by arranging the channel region at the safe distance from the boundary. Thus, a change in characteristic of the semiconductor element due to the stress can be prevented, while an increase in dead space can be avoided.

Figure 4A:
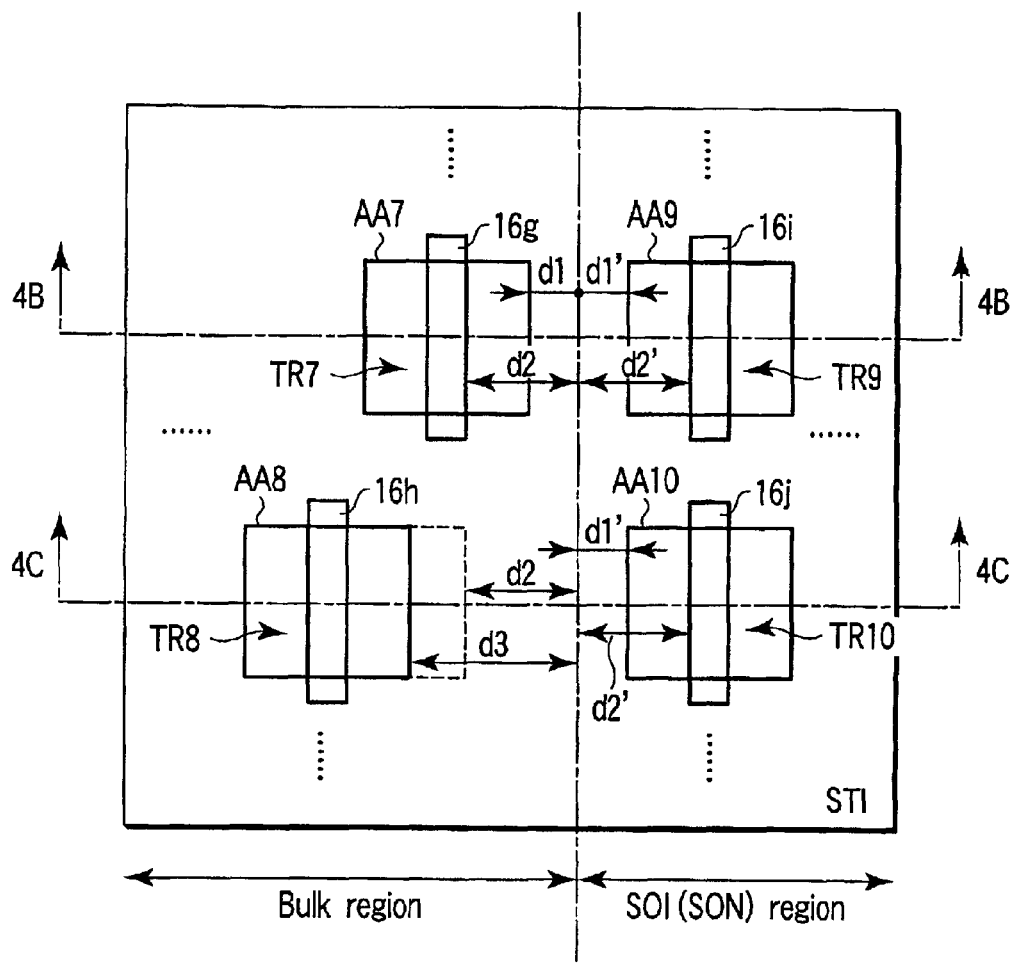
FIG. 4A is a plan view of a semiconductor device according to a second embodiment of the present invention.

A semiconductor device according to a second embodiment of the present invention will now be described. The semiconductor device of this embodiment has, in addition to the components of the first embodiment, a well region in an element region within the bulk region adjacent to the boundary between the bulk region and the SOI region. First, a planar structure of the semiconductor device of the second embodiment will be described with reference to FIG. 4A. FIG. 4A is a plan view of the semiconductor device, which has a patterned SOI structure.

As illustrated in FIG. 4A, the bulk region and the SOI region include element regions AA7 to AA10 electrically isolated from one another by element isolating regions STI. The element regions AA7 to AA10 respectively include MOS transistors TR7 to TR10. The MOS transistors TR7 to TR10 respectively have gate electrodes 16g to 16j, which extend parallel to the boundary between the bulk region and the SOI region.

The element region AA7 is spaced apart from the boundary at a distance d1. The channel region of the MOS transistor TR7 is spaced apart from the boundary at a safe distance d2. The element region AA8 is spaced apart from the boundary at a distance d3, which is longer than the safe distance d2. The element regions AA9 and AA10 are spaced apart from the boundary at a distance d1', and the channel regions of the MOS transistors TR9 and TR10 are spaced apart from the boundary at a safe distance d2'.

Figure 4B:
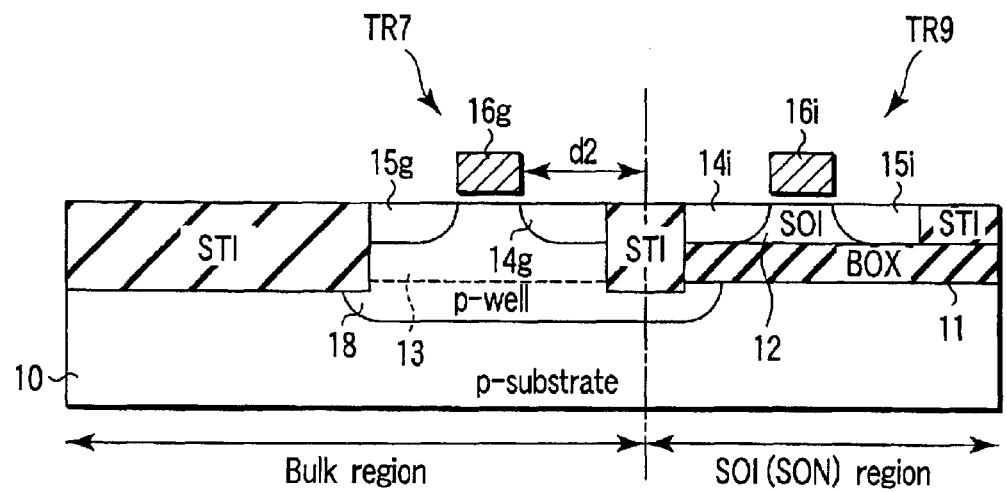
FIGS. 4B and 4C are cross-sectional views respectively taken along the lines 4B—4B and 4C—4C in FIG. 4A.
Figure 4C:
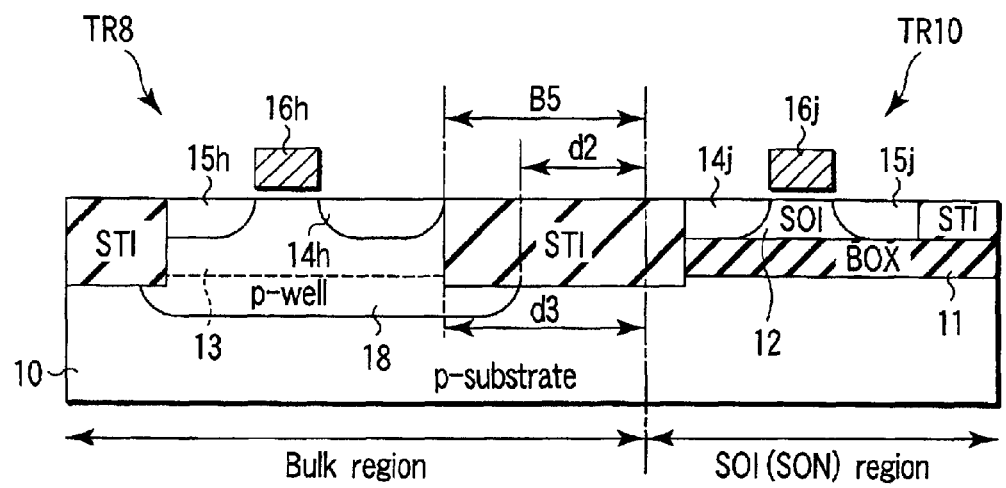

A cross-sectional structure of the semiconductor device shown in FIG. 4A will be described with reference to FIGS. 4B and 4C. FIGS. 4B and 4C are cross-sectional views respectively taken along the lines 4B—4B and 4C—4C in FIG. 4A.

As illustrated in the drawings, an SOI structure is formed in a part of a p-type silicon substrate 10. Since the SOI structure is the same as that of the first embodiment, an explanation thereof is omitted. The element regions AA7 and AA8 and the element regions AA9 to AA10 are respectively provided in the bulk region and the SOI region. Each of the element regions AA7 to AA10 is surrounded by element isolating regions STI. Since the element regions AA9 and AA10 have the same structure as that of the element region AA4 of the first embodiment, an explanation thereof is omitted. In the following, only the element regions AA7 and AA8 will be described.

As described above, the element regions AA7 and AA8 are spaced apart from the boundary at the distances d1 and d3, respectively. Each of the element regions AA7 and AA8 include a p-type well region 18 from the surface of the silicon layer 13 to the silicon substrate 10. The element regions AA7 and AA8 respectively include MOS transistors TR7 and TR8. The well region 18 in the element region AA7 extends to a portion of the silicon substrate 10 in the adjacent SOI region. The well region 18 in the element region AA8 is formed such that an end of the well region 18 adjacent to the boundary between the bulk region and the SOI region is spaced apart from the boundary by the safe distance d2. The MOS transistors TR7 and TR8 respectively include source regions 14g and 14h, drain regions 15g and 15h and gate electrodes 16g and 16h. The source regions 14g and 14h are respectively separated from the drain regions 15g and 15h in a surface region of the well region 18. The gate electrodes 16g and 16h are formed on a gate insulating film (not shown) provided on those parts of the well region 18 which are located between the source region 14g and the drain region 15g and between the source region 14h and the drain region 15h. The gate electrodes 16g and 16h extend parallel to the boundary between the bulk region and the SOI region. The MOS transistor TR7 is formed such that the source region 14g is adjacent to the boundary and the source region 14g is set to the same potential as that of the p-type well region 18. Further, the p-type well region 18 is set to the same potential as that of the silicon substrate 10.

In the semiconductor device according to this embodiment as described above, the well region 18 is located at the safe distance d2 from the boundary between the bulk region and the SOI region in the element region AA8 shown in FIG. 4A. It is commonly used art to provide the well region 18 in the silicon substrate 10 (and the silicon layer 13) to control the characteristics of the MOS transistor. In this case, it is necessary to consider the influence of a stress generated at the boundary between the bulk region and the SOI region on the boundary between the well region 18 and the silicon substrate 10. The stress acting on the boundary between the well region 18 and the silicon substrate 10 can be sufficiently attenuated by arranging the boundary between the well region 18 and the silicon substrate 18 spaced apart from the boundary between the bulk region and the SOI region at the safe distance d2 described above in connection with the first embodiment. Thus, the stress does not adversely affect the well region. Consequently, a change in characteristic of the semiconductor device due to the stress can be prevented, so that the reliability of the semiconductor device can be improved.

Moreover, in the semiconductor device of this embodiment, the p-type well region 18 in the element region AA7 shown in FIG. 4A, which has the same potential and conductivity type as those of the silicon substrate 10 and the silicon layer 13, extends to the adjacent SOI region. In general, the well region 18 must extend to a deep portion of the silicon substrate 10. Such a well region is formed by ion injection and annealing. Therefore, the well region generally has a shape widely spread in the lateral direction. Therefore, in the case of an arrangement as the element region AA8, a wide dead space may be formed. In FIG. 4C, a region B5 corresponding to the distance d3 is a dead space.

In the case of the element region AA7 in FIG. 4A, the stress acting on the boundary between the source region 14g and the silicon layer 13 influences little the MOS transistor. Moreover, the p-type well region 18 and the silicon substrate 10 have the same potential and conductivity type. Therefore, as in the case of the junction between the source region 14a and the silicon layer 13 of the first embodiment, even if crystal defects are generated in the junction between the well region 18 and the silicon substrate 10 owing to a stress, the MOS transistor is not easily influenced. Consequently, like the first embodiment, if the distance between the channel region 17 and the boundary between the bulk region and the SOI region is set to the safe distance d2 or longer, the characteristics of the MOS transistor can be prevented from being changed due to the stress. In other words, the distance d1 between the element region AA7 and the boundary can be shorter than safe distance d2. In this case, part of the p-type well region extends into the adjacent SOI region. However, since the well region 18 extending to the SOI region is insulated from the element region in the SOI region by the BOX layer 11, the semiconductor device is not adversely affected.

As described above, according to this embodiment, even in the case of a MOS transistor having a well region, a change in characteristic of the semiconductor device due to a stress generated at the boundary between the bulk region and the SOI region can be prevented. At the same time, an increase of a dead space can also be prevented. Since a semiconductor device including a well region tends to have a large dead space, this embodiment is particularly effective to such a case.

Figure 5A:
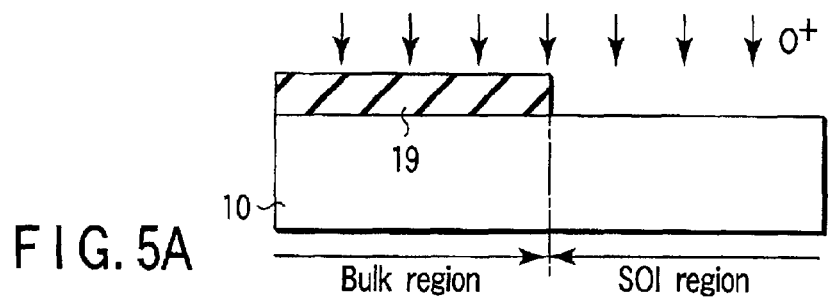
FIGS. 5A to 5C are cross-sectional views sequentially showing steps of manufacturing a semiconductor device according to a first modification of the first and second embodiments of the present invention.
Figure 5B:
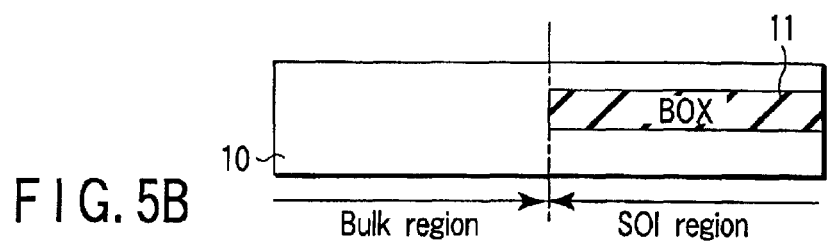
Figure 5C:
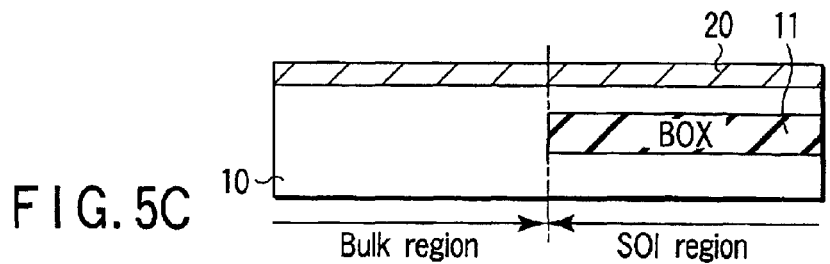

In the first and second embodiments, the semiconductor layer 13 may be part of the silicon substrate 10. This point will be described with reference to FIGS. 5A to 5C as a first modification of the first and second embodiments. FIGS. 5A to 5C are cross-sectional views sequentially showing part of the process of manufacturing a semiconductor device including a patterned SOI structure.

First, as shown in FIG. 5A, a masking material 19, for example, a silicon oxide film, is formed on a silicon substrate 10. That part of the masking material 19 in a region that is to serve as an SOI region is removed by photolithography and etching. Subsequently, oxygen ions are implanted into the silicon substrate 10. The implanted oxygen ions are activated by annealing. As a result, a BOX layer 11 is formed in the oxygen ion-implanted region as shown in FIG. 5B. In the case where a patterned SOI is formed by the above method, part of the silicon substrate 10 functions as the SOI layer 12 and the silicon layer 13 in the first and second embodiments.

The above manufacturing method is well known as SIMOX (Separation by Implanted Oxygen). With this method, it is difficult to form a thick SOI layer 12. Therefore, as shown in FIG. 5C, a silicon layer 20 may be sequentially formed on the silicon substrate 10 by epitaxial growth. In this case, the silicon substrate 10 and the silicon layer 20 functions as the SOI layer 12 and the silicon layer 13.

Figure 6A:
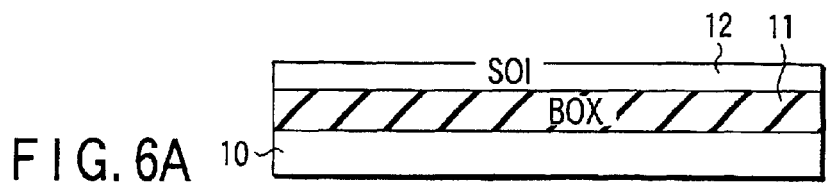
FIGS. 6A to 6C are cross-sectional views sequentially showing steps of manufacturing a semiconductor device according to a second modification of the first and second embodiments of the present invention.
Figure 6B:
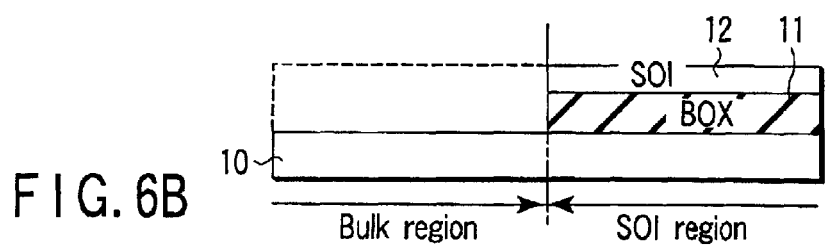
Figure 6C:
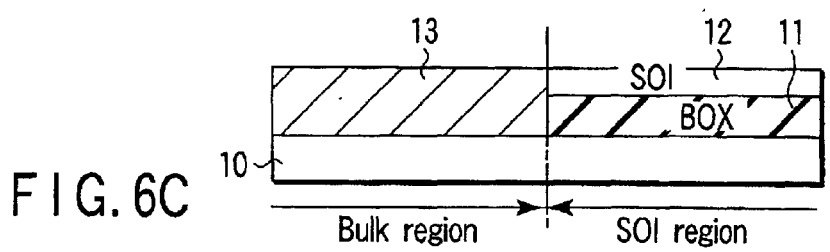

FIGS. 6A to 6C are cross-sectional views sequentially showing part of the process of manufacturing a patterned SOI for explaining a second modification of the first and second embodiments.

First, as shown in FIG. 6A, an SOI substrate including a silicon substrate 10, a BOX layer 11 and an SOI layer 12 is formed. The SOI substrate may be formed by SIMOX mentioned above, or by sticking silicon substrates together. Then, as shown in FIG. 6B, part of the SOI region 12 and the BOX region 11 in a region, which is to serve as a bulk region, is removed. Thereafter, as shown in FIG. 6C, a silicon layer 13 is formed on that part of the silicon substrate 10 in the bulk region by epitaxial growth. In the case where a patterned SOI structure is formed by this method, part of the silicon substrate 10 or part of a silicon substrate stuck on the silicon substrate 10 functions as the SOI layer 12 of the first and second embodiments. The silicon layer 13 is an epitaxial layer formed on the silicon substrate 10.

Figure 7A:
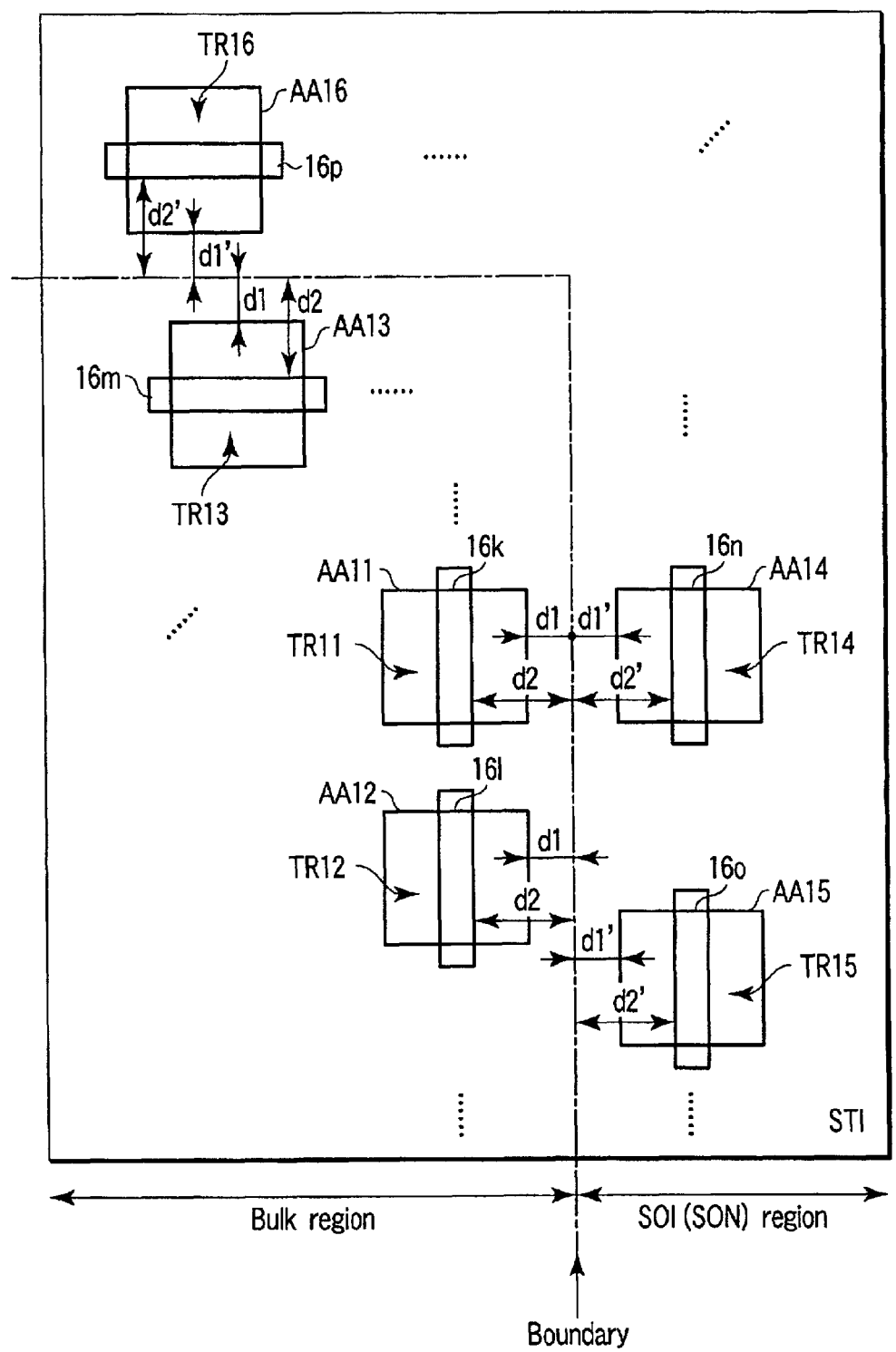
FIG. 7A is a plan view showing a semiconductor device according to a third modification of the first and second embodiments of the present invention.

FIG. 7A is a plan view of a semiconductor device according to a third modification of the first and second embodiments. As illustrated in FIG. 7A, the bulk region includes element regions AA11 to AA13 and the SOI region includes element regions AA14 to AA16. As in the first and second embodiments, the element regions AA11 and AA14 are aligned with each other on the opposite sides of the boundary between bulk region and the SOI region. However, they need not be aligned with each other but may be deviated, as the element regions AA12 and AA15. Further, it is only necessary that the gate electrodes extend parallel to the boundary. Therefore, the MOS transistors may be arranged in the direction as shown in the element regions AA13 and AA16.

Figure 7B:
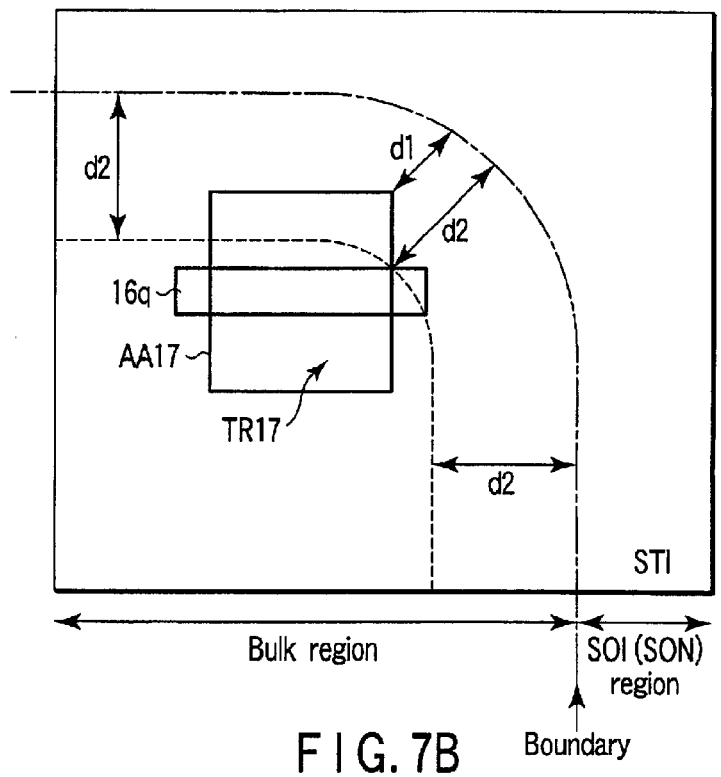
FIG. 7B is a plan view showing a semiconductor device according to a fourth modification of the first and second embodiments of the present invention.

FIG. 7B is a plan view of a semiconductor device according to a fourth modification of the first and second embodiments. In this modification, the corner portion of the boundary between the bulk region and the SOI region of the third modification is particularly taken into account. As illustrated in FIG. 7B, an element region AA17 is provided in proximity to the corner portion of the boundary. The element region AA17 includes a MOS transistor TR17 having a gate electrode 16q, which extends parallel to either line of the boundary. In general, the corner portion of a patterned SOI structure in the plan view is deformed to an arc shape in the manufacturing process. Therefore, when a MOS transistor is arranged near the corner portion of the boundary, it is important to separate the channel region from the corner portion at the safe distance d2 or longer, as shown in FIG. 7B.

Figure 8A:
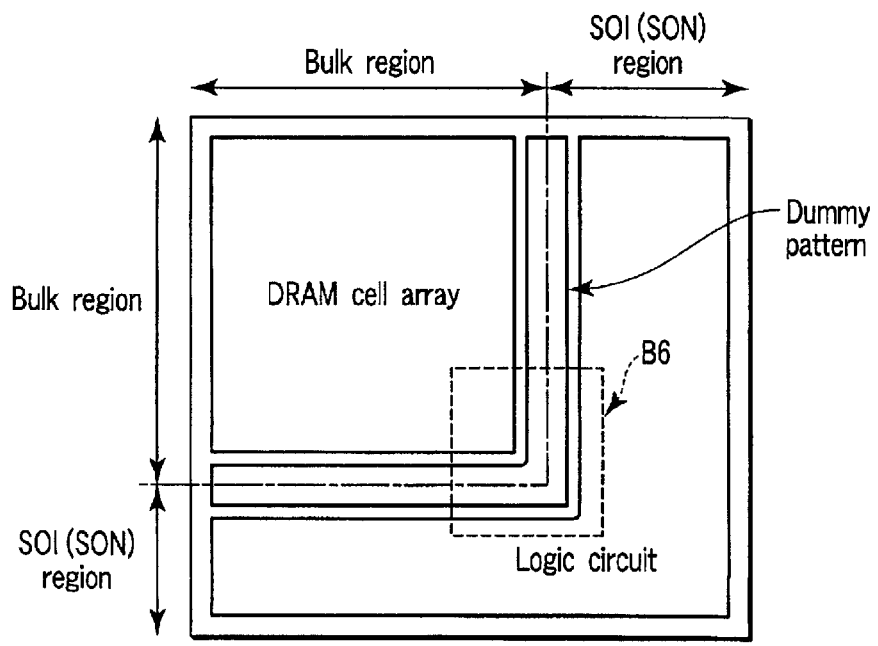
FIG. 8A is a plan view of a semiconductor device according to a third embodiment of the present invention.

A semiconductor device according to a third embodiment of the present invention will now be described with reference to FIG. 8A. FIG. 8A is a plan view of a system LSI embedded a DRAM using a patterned SOI structure.

As illustrated in FIG. 8A, a DRAM cell array is formed in a bulk region of the patterned SOI structure as in the first and second embodiments, and a logic circuit is formed in the SOI region. A DRAM cell dummy pattern is formed in the boundary portion between the bulk region and the SOI region.

Figure 8B:
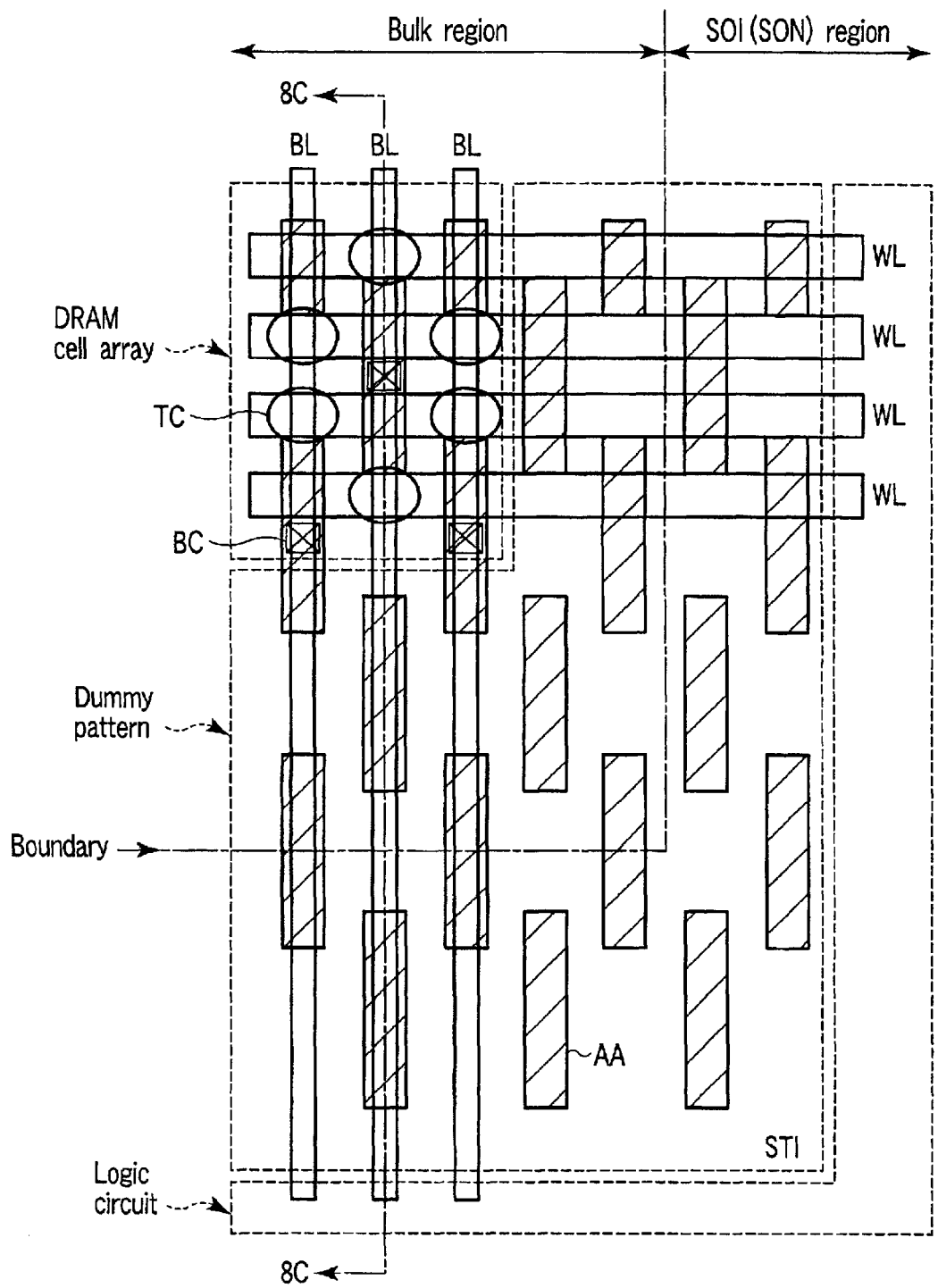
FIG. 8B is an enlarged view of a part of FIG. 8A.

FIG. 8B is an enlarged view of a region B6 in FIG. 8A. As illustrated, a plurality of element regions AA are arranged in a staggered manner in the bulk region. The diagonally shaded portions in FIG. 8B represent the element regions AA. The element regions AA are surrounded by element isolating regions STI. Each element region has a length 5F (F is a minimum processing dimension) in the longitudinal direction and a length 1F in the direction perpendicular to the longitudinal direction. The DRAM cell array comprises a plurality of memory cells, each having a cell transistor provided in the element region AA and a trench-type cell capacitor TC provided on the ends in the longitudinal direction of the element region AA. A plurality of bit lines BL are arranged along the longitudinal direction of the element regions AA. Each bit line consists of bit line wires BL and bit line contact plugs BC to the memory cells located in the same column. Further, a plurality of word lines are arranged perpendicular to the longitudinal direction of the element regions AA. Each word line WL is electrically connected to the gate electrodes located on the same row.

Element regions AA of the same pattern as that of the element regions in the DRAM cell are formed in the boundary portion between the bulk region and the SOI region. These element regions in the boundary portion constitute the dummy pattern. In a DRAM or the like, numerous memory cells are regularly arranged in an array. However, the regularity is disordered in an end portion of the DRAM cell array. If the arrangement of the memory cells is disordered, conditions in lithography or etching in the end portion of the DRAM cell array will be liable to change. In this case, it will be difficult to ensure the reliability of the memory cell. To solve this problem, a dummy pattern having the same pattern as that of the DRAM cell array is formed outside the DRAM cell array, thereby ensuring the reliability of the memory cells in the DRAM cell arrays. This is commonly used art. In this embodiment, the dummy pattern is formed in the boundary portion between the bulk region and the SOI region.

A description of the logic circuit formed in the SOI region is omitted.

Figure 8C:
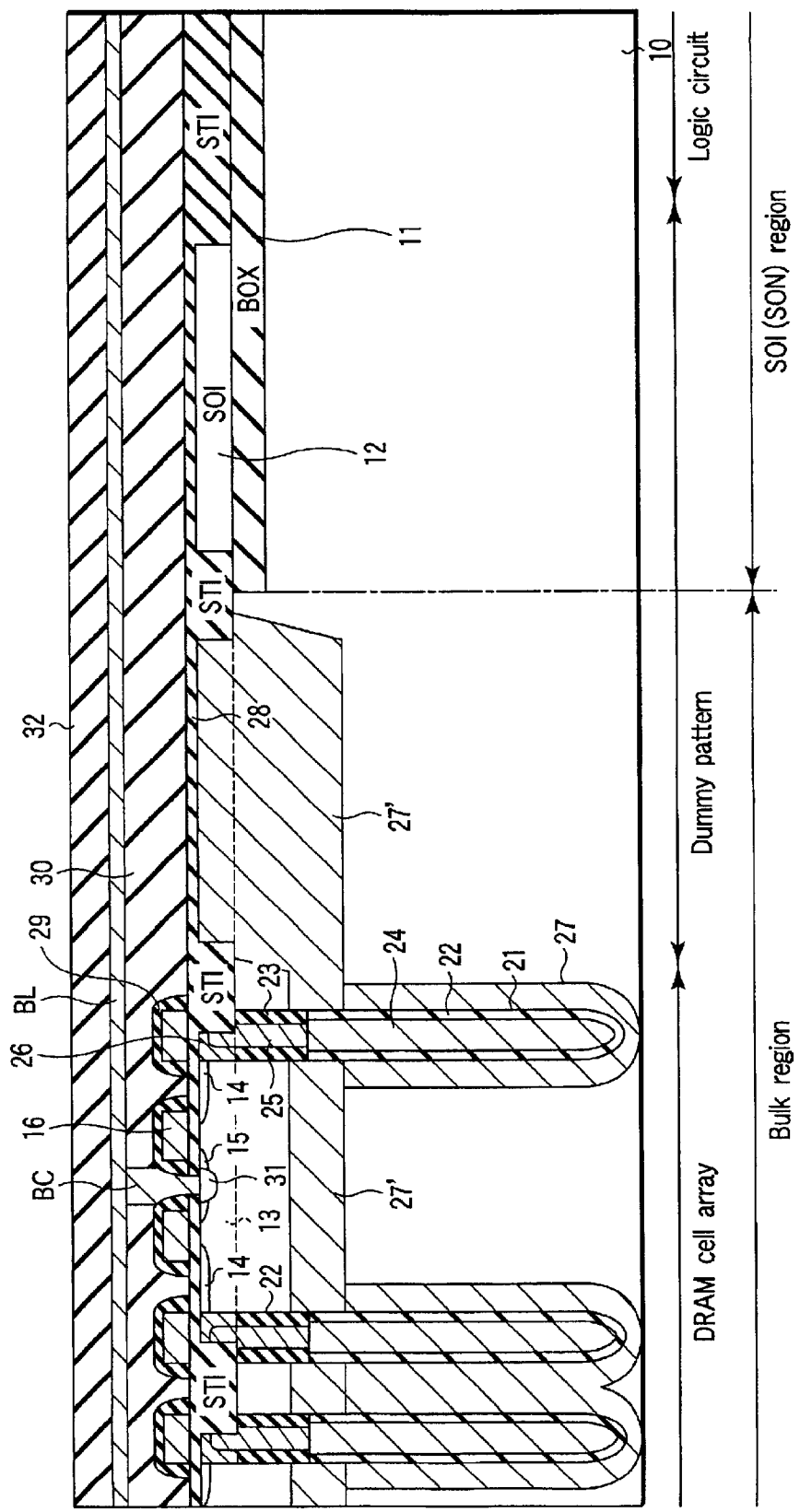
FIG. 8C is a cross-sectional view taken along the line 8C—8C in FIG. 8A.

A cross-sectional structure of the system LSI shown in FIG. 8B will be described with reference to FIG. 8C. FIG. 8C is a cross-sectional view taken along the line 8C—8C in FIG. 8B. First, a structure of the DRAM cell array in the bulk region will be described.

A trench 21 for forming a trench capacitor TC is provided in the p-type silicon layer 13 and the p-type silicon substrate 10. A capacitor insulating film 22 is provided on all inner surface of the trench 21 except for an upper portion thereof. A collar oxide film 23 thicker than the capacitor insulating film 22 is provided on the upper portion of the inner surface of the trench 21, where the capacitor insulating film 22 is not formed, and except for the uppermost portion. A storage node electrode 24 is buried partway in the trench 21. A conductive layer 25 is formed on the storage node 24. A conductive layer 26 of low resistance is provided on the uppermost portion of the trench 21 near the opening portion. An $n^+$-type impurity diffusion layer 27 is formed in the silicon substrate 10 so as to be in contact with the capacitor insulating film 22. The $n^+$-type impurity diffusion layer 27 functions as a plate electrode. Further, an n-type well region 27' connected in common to a plurality of $n^+$-type impurity diffusion layers 27 is formed in the silicon substrate 10. Thus, the trench-type cell capacitor TC is formed.

A gate electrode 16 is formed on an insulating film 28, which is formed on the silicon layer 13. An insulating film 29 is provided so as to cover the gate electrode 16. $N^+$-type source and drain regions 14 and 15 are formed in a surface region of the silicon layer 13. As a result, the cell transistor is formed. The source region 14 of the cell transistor is electrically connected to the conductive layer 26 of the cell capacitor TC. DRAM cells, each including the cell transistor and the cell capacitor as described above, are provided in the DRAM cell array. Two DRAM cells are arranged in each of the element regions AA, which are electrically isolated from one another by element isolating regions STI. The two DRAM cells have one common drain region 15.

An interlayer insulating film 30 is provided on the silicon layer 13 to cover the DRAM cells. An $n^{++}$-type contact region 31 of a high impurity concentration is provided in the drain region 26 in contact with the bit line contact plug BC. A bit line wire BL, electrically connected to the bit line contact plugs BC, is provided on the interlayer insulating film 30.

The boundary portion between the bulk region and the SOI region has the dummy pattern including the element regions AA of the same pattern as that of the DRAM cell, but no semiconductor element is formed in the element regions. However, the n-type well region 27' connected to the $n^+$-type impurity diffusion layer 27 of the cell transistor is formed in the dummy pattern to reach the surface of the silicon layer 13. In this region, a plate potential is applied to the p-type well region 27'. An interlayer insulating film 32 covers the above-mentioned DRAM cell array, the dummy pattern and the logic circuit.

With the semiconductor device of this embodiment, the dummy pattern is provided in the boundary portion between the bulk region and the SOI region. As described above in connection with the first and second embodiments, since the boundary portion between the bulk region and the SOI region receives a strong stress, it is a dead space, not suited for formation of a semiconductor element. The dummy pattern per se does not function as a semiconductor element, although it is indispensable to maintain the reliability of the cell array and the like. Therefore, the region where the dummy pattern is formed is also a dead space. In this embodiment, since the dummy pattern is formed in the dead space, i.e., the boundary portion between the bulk region and the SOI region, the dead space can be reduced, while change in characteristics of the cell array due to a stress can be prevented.

Figure 9:
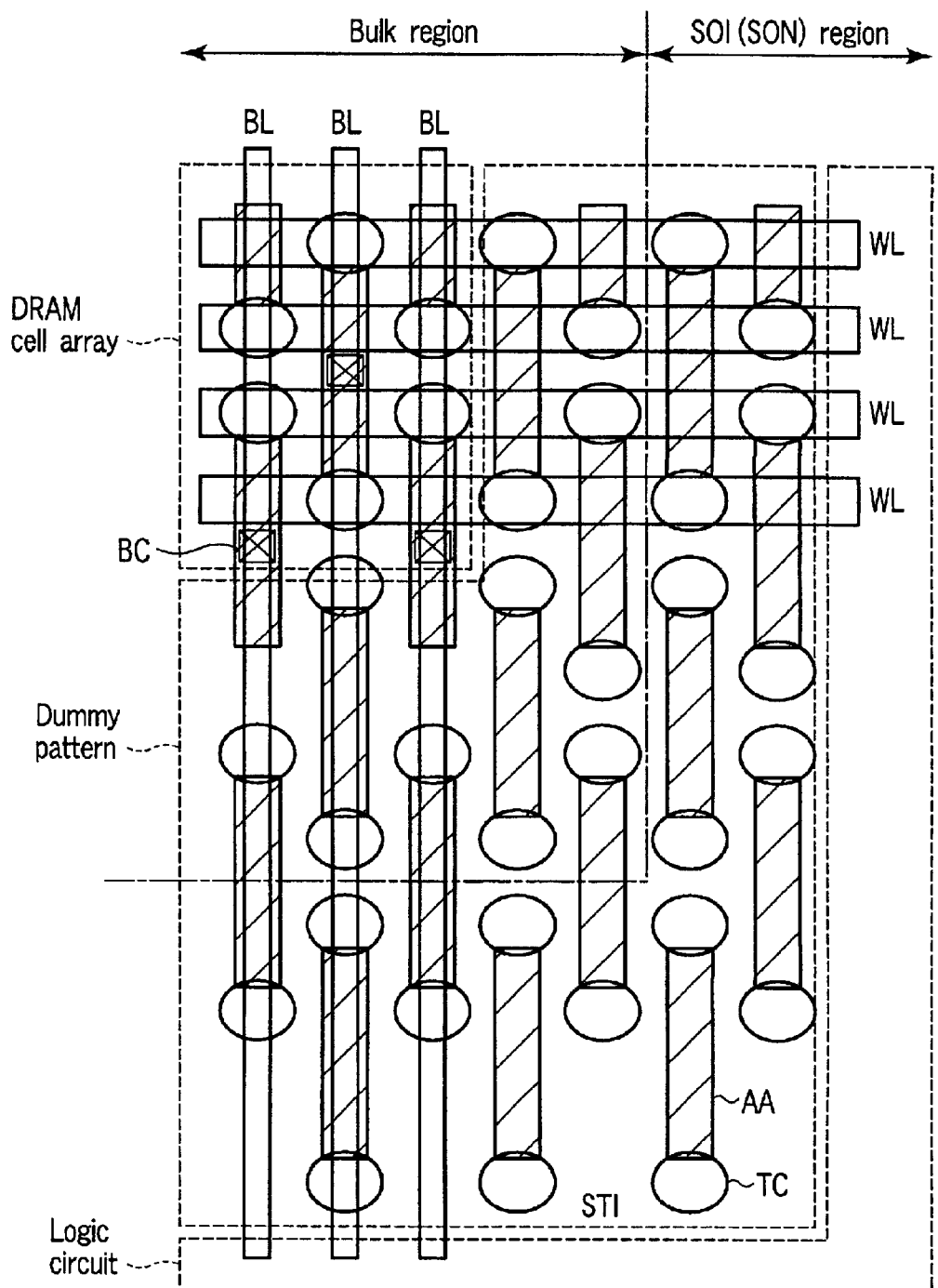
FIG. 9 is a cross-sectional view of a semiconductor device according to a modification of the third embodiment.

In this embodiment, only the element regions AA are formed in the boundary portion between the bulk region and the SOI region. However, trench capacitors may additionally be formed, as shown in FIG. 9. Dummy memory cells may also be formed. However, if the BOX layer 11 obstructs etching or the like when the trenches 21 are formed, it is preferable that the trench capacitors be not formed in the dummy pattern, as shown in FIG. 8B. The dummy pattern may have a memory structure having stack-type cell capacitors. This embodiment is not limited to the LSI embedded a semiconductor memory device, but may be widely applied to a semiconductor device having a plurality of semiconductor elements arranged as an array, which requires a dummy pattern.

Figure 10A:
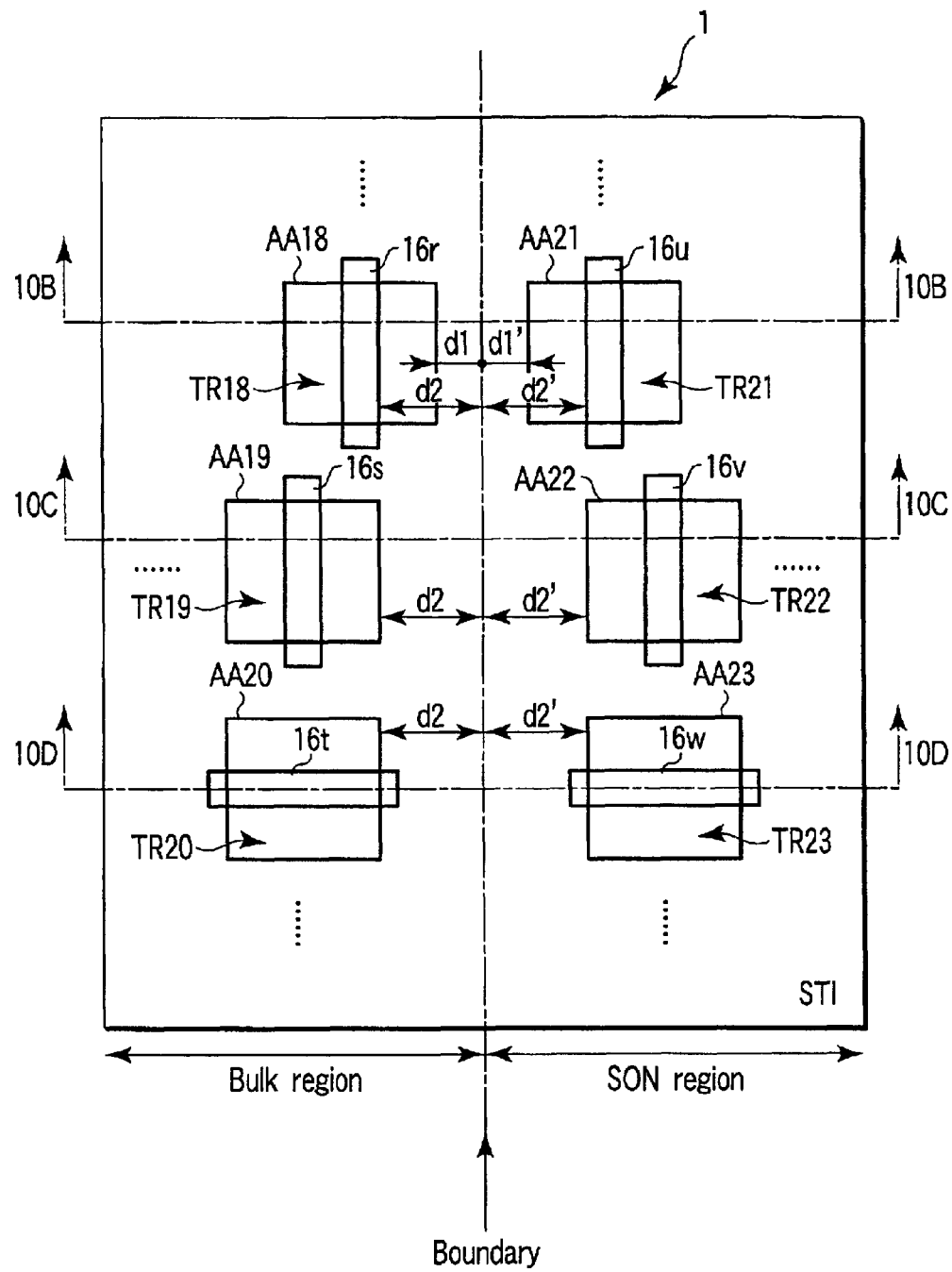
FIG. 10A is a plan view showing a semiconductor device according to a fourth embodiment of the present invention.

A semiconductor device according to a fourth embodiment of the present invention will be described with reference to FIG. 10A. FIG. 10A is a plan view of a semiconductor device having a patterned SON structure. In this embodiment, the element arrangement of the first embodiment is applied to a semiconductor device having a patterned SON structure instead of the patterned SOI structure.

As shown in FIG. 10A, the semiconductor device 1 has a bulk region and an SON region. SON, which means a silicon layer formed on a cavity, will be described later in detail. The bulk region and the SON region include element regions AA18 to AA23, which are electrically isolated from one another by element isolating regions STI. The element regions AA18 to AA23 respectively include MOS transistors TR18 to TR23. The planar structure of the element regions AA18 to AA23 is the same as that of the element regions AA1 to AA6 of the first embodiment. Therefore, a description thereof is omitted.

Figure 10B:
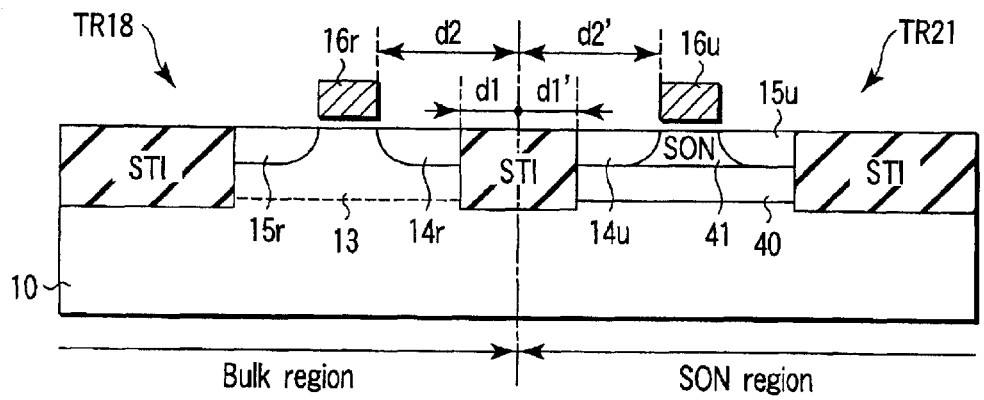
FIGS. 10B, 10C and 10D are cross-sectional views respectively taken along the lines 10B—10B, 10C—10C and 10D—10D in FIG. 10A.
Figure 10C:
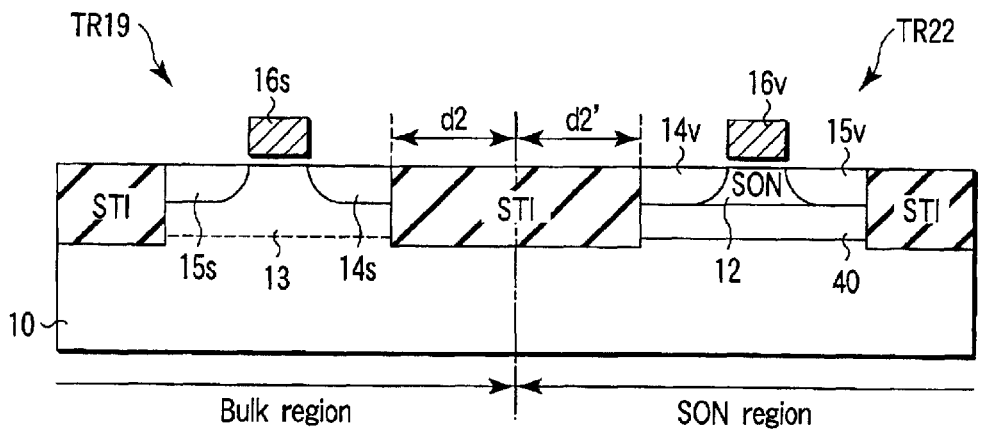
Figure 10D:
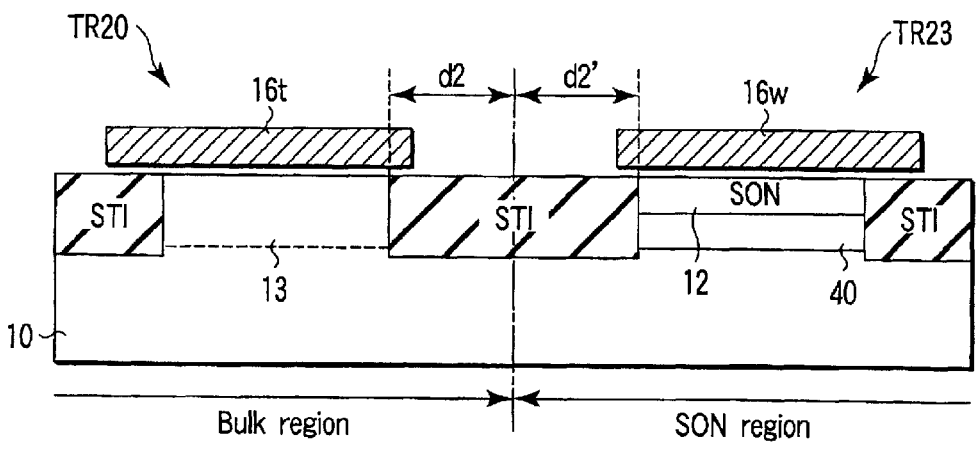

FIGS. 10B to 10D are cross-sectional views respectively taken along the lines 10B—10B, 10C—10C and 10D—10D in FIG. 10A. Since the structure of the bulk region is the same as that of the first embodiment, only the SON region will be described below.

As illustrated in FIGS. 10B to 10D, an SON structure is formed in part of a silicon substrate 10. In other words, a cavity 40 is formed on part of the silicon substrate 10. A semiconductor layer 41 is formed above the silicon substrate 10 with the cavity 40 interposed therebetween. The semiconductor layer 41 is, for example, a silicon layer, and hereinafter referred to as the SON layer. The region, in which the SON structure including the cavity 40 and the SON layer 41 on the silicon substrate 10 is formed, is called the SON region. The SON layer 40 is electrically isolated form the silicon substrate 10 by the cavity 40. Therefore, the structure of this embodiment can provide the same effect as that obtained by the SOI structure described above with reference to FIGS. 1B to 1D, which has the BOX layer 11 formed between the silicon substrate 10 and the SOI layer 12. The SON region includes the element regions AA 21 to AA23, each surrounded by the element isolating regions STI. The element isolating regions STI in the SON region reach the silicon substrate 10.

The element regions AA21 to AA23 respectively include MOS transistors TR21 to TR23. Each of the MOS transistors TR21 to TR23 has source and drain regions and a gate electrode. Source regions 14$u$ and 14$v$ and drain regions 15$u$ and 15$v$ of the MOS transistors TR21 and TR22 are formed to reach the cavity 40. Gate electrodes 16$u$ and 16$v$ of the MOS transistors TR21 and TR22 are formed on a gate insulating film (not shown) provided on those parts of the SON layer 41 which are located between the source region 14$u$ and the drain region 15$u$ and between the source region 14$v$ and the drain region 15$v$. Likewise, in the MOS transistor TR23, source and drain regions (not shown), separated from each other, are formed in a surface region of the SON layer 41 in the element region AA23. A gate electrode 16$w$ is formed on a gate insulating film (not shown) provided on that part of the SON layer 41 which is located between the source and drain regions.

The element regions AA22 and AA23 are spaced apart from the boundary between the bulk region and the SON region by a safe distance d2'. On the other hand, the element region AA21 is spaced apart from the boundary region by a distance d1', shorter than the safe distance d2'. However, the channel region of the MOS transistor TR21 is separated from the boundary at least the safe distance d2'.

Thus, the semiconductor device having a patterned SON structure an also provides the effect of the first embodiment described above. More specifically, in the SON region, the source and drain regions 15u and 15w reach the bottom surface of the SON layer 41. Therefore, even if a stress is generated at the bottoms of the source and drain regions 15u and 15w, no leakage current can flow. Therefore, since it is only necessary to consider a stress generated at a channel region, element regions can be arranged close to the boundary between the bulk region and the SON region, so that the dead space can be reduced. Since the SON layer 41 is formed on the cavity 40, it is desirable that the element isolating regions STI in the bulk region and in the boundary portion between the bulk region and the SON region be formed in a process different from that for forming the element isolating regions STI in the SON region. The element isolating regions STI in the bulk region and in the boundary portion may be formed in the same process.

The semiconductor device according to the second or third embodiment, as well as the first embodiment, may have a patterned SON structure. In other words, the SOI regions shown in FIGS. 4A to 4C and FIGS. 7A to 9 may be replaced with the SON regions. In this case, a cavity may be provided instead of the BOX layer 11 and an SON layer may be provided instead of the SOI layer 12 in FIGS. 4B, 4C and 8C.

As described above, according to the first to fourth embodiments of the present invention, it is possible to provide a semiconductor device in which a change in characteristic due to a stress can be prevented.

In the drawings that illustrate the first to third embodiments, the boundary between the bulk region and the SOI region is located at the center of the element isolating region STI between these regions. However, as shown in FIGS. 5A to 5C and 6A to 6C, the boundary between the bulk region and the SOI region is actually the end of the BOX layer 11 at the stage where the patterned SOI structure is formed. The same applies to the SON structure. The safe distances d2 and d2' in the bulk region and the SOI region may be the same or different. In the above embodiment, the upper surfaces of the silicon layer 13 and the SOI layer 12 are located on the same plane. However, they may be on different planes, depending on the manufacturing method. The upper surfaces of the silicon layer 13 and the SON layer 41 may also be on different planes. Further, the bottom surfaces of the silicon layer 13 and the BOX layer 11 may be on different planes, and the bottom surfaces of the silicon layer 13 and the cavity 40 may on different planes. Furthermore, the second and third embodiments may be combined to form a DRAM cell on a well region of the same conductivity type and potential as those of the silicon substrate 10. In the descriptions of the above embodiments, the system LSI embedded a DRAM is described as an example. However, the present invention is not limited thereto, but can be applied to a semiconductor device including, for example, a SRAM (Static RAM), a flash memory or a ferroelectric RAM.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first semiconductor layer provided on and electrically connected to a semiconductor substrate;
   a second semiconductor layer formed above the semiconductor substrate via one of an insulating film and a cavity interposed therebetween;
   a first element region provided in one of the first and second semiconductor layers and located at a first distance from a boundary between the first and second semiconductor layers;
   a second element region provided in said one of the first and second semiconductor layers where the first element region is provided, and located at a second distance longer than the first distance from the boundary between the first and second semiconductor layers;
   a first MOS transistor provided in the first element region and having a gate electrode arranged parallel to the boundary between the first and second semiconductor layers; and
   a second MOS transistor provided in the second element region and having a gate electrode arranged perpendicular to the gate electrode of the first MOS transistor.

2. The semiconductor device according to claim 1, wherein a junction between channel and source regions of the first MOS transistor is located at at least the second distance from the boundary between the first and second semiconductor layers.

3. The semiconductor device according to claim 1, wherein:
   the first and second element regions are provided in the first semiconductor layer; and
   a source region of the first MOS transistor is provided nearer to the boundary between the first and second semiconductor layers than the drain region is.

4. The semiconductor device according to claim 1, wherein:
   the first and second element regions are provided in the first semiconductor layer; and
   a source region of the first MOS transistor has same potential as that of the first semiconductor layer.

5. The semiconductor device according to claim 1, wherein:
   the first and second element regions are provided in the second semiconductor layer; and
   source and drain regions of the second MOS transistor reach a bottom of the second semiconductor layer.

6. The semiconductor device according to claim 1, further comprising an insulating film provided on the semiconductor substrate, wherein the second semiconductor layer is provided above the semiconductor substrate with the insulating film interposed therebetween.

7. The semiconductor device according to claim 1, wherein the second semiconductor layer is provided above the semiconductor substrate with the cavity interposed therebetween.

8. A semiconductor device comprising:
   a first semiconductor layer provided on and electrically connected to a semiconductor substrate; and
   a second semiconductor layer formed above the semiconductor substrate with one of an insulating film and a cavity interposed therebetween, and part of the first semiconductor layer being in contact with a lower surface of one of the insulating film and a cavity, the first and second semiconductor layers having upper surfaces in substantially a same plane and being arranged side by side in a horizontal direction.

9. The semiconductor device according to claim 8, further comprising a MOS transistor having source and drain regions separated from each other in a surface region of the third semiconductor layer and a gate electrode provided on a gate insulating film formed on part of the third semiconductor layer between the source and drain regions, the gate electrode extending in parallel to the boundary between the first and second semiconductor layers and the source region being provided near the boundary than the drain region.

10. The semiconductor device according to claim 8, wherein the first semiconductor layer has a same conductivity type as that of the semiconductor substrate.

11. The semiconductor device according to claim 8, wherein the first semiconductor layer has a same potential as that of the semiconductor substrate.

12. The semiconductor device according to claim 8, further comprising an insulating film formed on the semiconductor substrate, wherein the second semiconductor layer is provided above the semiconductor substrate with the insulating film interposed therebetween.

13. The semiconductor device according to claim 8, wherein the second semiconductor layer is provided above the semiconductor substrate with the cavity interposed therebetween.

14. A semiconductor device comprising:
a first semiconductor layer provided on and electrically connected to a semiconductor substrate;
a second semiconductor layer formed above the semiconductor substrate with one of an insulating film and a cavity interposed therebetween;
a group of semiconductor elements provided in one of the first and second semiconductor layers; and
a group of dummy elements for the semiconductor elements provided on the first and second semiconductor layers near the boundary, the group of dummy elements being formed between the first and second semiconductor layers.

15. The semiconductor device according to claim 14, wherein the semiconductor elements and the dummy elements have different structures.

16. The semiconductor device according to claim 14, wherein the semiconductor elements are memory cells.

17. The semiconductor device according to claim 14, further comprising an insulating film formed on the semiconductor substrate, wherein the second semiconductor layer is provided above the semiconductor substrate with the insulating film interposed therebetween.

18. The semiconductor device according to claim 14, wherein the second semiconductor layer is provided above the semiconductor substrate with the cavity interposed therebetween.

19. A semiconductor device comprising:
a first semiconductor layer provided on and electrically connected to a semiconductor substrate;
a second semiconductor layer formed above the semiconductor substrate with one of an insulating film and a cavity interposed therebetween, and part of the first semiconductor layer coming in contact with a lower surface of one of the insulating film and a cavity the first and second semiconductor layers being arranged side by side in a horizontal direction; and
an isolation region which is formed between the first and second semiconductor layers and which electrically isolates the first and second semiconductor layers.

* * * * *